(12) United States Patent
Nehmeh

(10) Patent No.: US 9,612,262 B1
(45) Date of Patent: Apr. 4, 2017

(54) CURRENT MEASUREMENT SENSOR AND SYSTEM

(71) Applicant: Neeme Systems Solutions, Inc., Glendale, AZ (US)

(72) Inventor: Jody Nehmeh, Glendale, AZ (US)

( * ) Notice: Subject to any disclaimer, the term of this patent is extended or adjusted under 35 U.S.C. 154(b) by 643 days.

(21) Appl. No.: 13/724,311

(22) Filed: Dec. 21, 2012

(51) Int. Cl.
*G01R 15/20* (2006.01)

(52) U.S. Cl.
CPC ................... *G01R 15/202* (2013.01)

(58) Field of Classification Search
None
See application file for complete search history.

(56) References Cited

U.S. PATENT DOCUMENTS

| | | | |
|---|---|---|---|
| 3,323,057 A | 5/1967 | Haley | |
| 4,450,427 A | 5/1984 | Gareis | |
| 4,482,862 A | 11/1984 | Leehey | |
| 4,580,095 A * | 4/1986 | De Vries | 324/126 |
| 4,625,166 A * | 11/1986 | Steingroever | G01R 33/07 324/117 H |
| 5,252,921 A | 10/1993 | Nakane et al. | |
| 5,459,395 A | 10/1995 | Berkcan | |
| 5,521,501 A | 5/1996 | Dettmann et al. | |
| 5,754,387 A | 5/1998 | Tennies et al. | |
| 5,943,204 A | 8/1999 | Jones et al. | |
| 6,414,475 B1 * | 7/2002 | Dames et al. | 324/127 |
| 6,512,380 B2 | 1/2003 | Turvey | |
| 6,531,862 B1 * | 3/2003 | Stanley | G01R 15/183 324/114 |
| 6,642,705 B2 * | 11/2003 | Kawase | G01R 15/20 324/117 H |
| 7,323,870 B2 | 1/2008 | Tatschl et al. | |
| 7,859,105 B2 * | 12/2010 | Nakatsu et al. | 257/734 |
| 8,878,524 B2 * | 11/2014 | Heberle | 324/207.2 |
| 2004/0201374 A1 | 10/2004 | Kawase | |
| 2006/0082357 A1 * | 4/2006 | Tsukamoto | G01R 15/20 324/126 |
| 2007/0076334 A1 | 4/2007 | Battani et al. | |
| 2008/0054896 A1 | 3/2008 | Kahlman | |
| 2009/0058412 A1 | 3/2009 | Taylor et al. | |
| 2010/0301835 A1 | 12/2010 | Kasajima | |
| 2011/0057650 A1 | 3/2011 | Hellwig et al. | |
| 2011/0169488 A1 | 7/2011 | Mather | |
| 2011/0215801 A1 | 9/2011 | Dieny | |
| 2011/0221429 A1 | 9/2011 | Tamura | |
| 2011/0221436 A1 | 9/2011 | Ichinohe et al. | |

OTHER PUBLICATIONS

Ametes Bus Bar Module Current Sensor BBMXX-KIT-I Datasheet, Jun. 5, 2008.

(Continued)

*Primary Examiner* — Paresh Patel
(74) *Attorney, Agent, or Firm* — Paul B. Heynssens Attorney at Law, PLC

(57) ABSTRACT

An electric current measuring device that employs a unique mechanical structure and Hall effect sensor array combined with processing of measurements obtained from the current measuring device to accurately measure current flow by cancelling the effects of static or dynamic magnetic noise originating from external sources. The process determines the actual current through the conductor by measuring and subtracting external noise.

12 Claims, 12 Drawing Sheets

528
CURRENT SENSOR INCORPORATED IS A POWER CONTACTOR APPLICATION

(56) References Cited

OTHER PUBLICATIONS

Ametes Bus Bar Module DC Current Sensor BBM-01 Datasheet, May 15, 2008.
Ametes Bbm-Schematic, Nov. 2008, (one page).
Ametes Bus Bar DC Current Sensor Design Guide AN_BBM-01, Feb. 4, 2009.
Luca Di Rienzo et al., Circular Arrays of Magnetic Sensors for Current Measurement, IEEE Transactions on Instrumentation and Measurement, vol. 50, No. 5, Oct. 2001, pp. 1093-1096.
Douglas P. McNutt, Current Measurement, 1999, CRC Press LLC, (Nineteen Pages).
P. Ripka, Current Sensors Using Magnetic Materials, Journal of Optoelectronics and Advanced Materials vol. 6, No. 2, Jun. 2004, p. 587-592.
Eaton Relay Catalog, Mar. 2009, (Fifty Two Pages).
ECSW Series Current Sensor Datasheet, 2009.
Series CSHM Hall Effect Current Sensor for Measurement Engineering Data Sheet, Mar. 2006.
Series CSHPB Hall Effect Current Sensor for Battery Bus Direct and Return Protection Engineering Data Sheet, Mar. 2006.
Angelo Manara et al., Low-Cost Current Transducer Based on Circular Array of Magnetic Sensors, 11th IMEKO TC-4 Symp.—Trends in Electrical Measurement and Instrumentation—Sep. 13-14, 2001—Lisbon, Portugal, pp. 135-139.
Intelligent Technology, LV Soft Starter IT Features Functions PowerPoint presentation, Fourty Nine Pages.
Radivoje S. Popvic, Hall ASICs with Integrated Magnetic Concentrators.
AsahiKASEI Small-Sized Current Sensor CQ-121E, CQ-131E Datasheet, Oct. 2008.

\* cited by examiner conventional Hall effect current measurement system that tends to be less invasive
300

412
UNIQUE CURRENT SENSOR MECHANICAL STRUCTURE WITH HALL EFFECT SENSORS

528
CURRENT SENSOR INCORPORATED IS A POWER CONTACTOR APPLICATION

CURRENT SENSOR IN A POWER DISTRIBUTION SYSTEM
700

3-phase CS Configuration
1000

CURRENT MEASUREMENT SENSOR AND SYSTEM

TECHNICAL HELD

This description relates generally to current sensors and more specifically to Hall effect current sensing systems

BACKGROUND

In electrical circuits fundamental quantities that are measured include current and voltage. Current is the movement of charge, or electrons, through a conductor, such as a wire. Materials such as a wire and the like have an inherent resistance to the flow of current, which produces a voltage across the conductor or resistive material. The movement of charge through a conductor also produces a magnetic field or force about the conductor. In both instances the voltage produced, and the magnetic field produced, are proportional to the current that produced them. Accordingly by devising various apparatuses and methods of detecting voltages (A somewhat intrusive measurement technique because of direct contact with the circuit) and magnetic fields currents (A somewhat non-intrusive measurement technique because of direct contact with the circuit is not needed.) may be measured.

For example both alternating current and DC current measurements may be made by measuring the voltage across a resistor having a current to be measured flowing through it. AC currents may be made by using a simple transformer in a circuit. And DC currents may be measured by a Hall effect device. Each of these measurement techniques have various strengths and limitations, a few of which are worth pointing out especially with respect to Hall effect devices.

Using a resistor to measure current requires imposing another circuit element by direct physical contact into a circuit. The presence of this resistor must be accounted for in the design of the circuit being measured. Using very small value resistors, on the order of 0.001 Ohms, or the like can minimize the effect on a circuit from the resistor used to measure current, but at large values of current the effect can still be not insignificant.

The known intrusive measurement methods are mostly utilizing current shunts. Current shunt measuring method is essentially a low resistance high precision resistor placed in series with the current flow. Voltage monitors or voltmeters are able to pick up the induced voltage drop across the resistor and convert the measured voltage to a corresponding current using Ohm's law.

A problem with the current shunts occurs with temperature rise. As the voltage drop across the resistor will change as the temperature rises, and therefore the measurement needs an added correction factor. Additionally, in order to properly dissipate heat, the shunt terminals are often made from bulky and heavy brass.

The Hall effect device is useful since it does not have to be in physical contact (noninvasive) with the circuit who's current is being measured, eliminating any problems that might be associated with Ohmic drop across a resistor, but Hall effect devices can require calibration and degaussing in order to obtain an accurate measurement.

In addition a Hall effect sensor is susceptible to interference from other magnetic fields that might impinge on its circuitry from adjacent conductors and the like. This problem of interfering magnetic fields causing distortion in the measurements is increasingly problematic as Hall effect sensors are increasingly used in environments having crowded circuitry and other interference mechanisms, or electromagnetic interference ("EMI") generators closer than would be desired.

Accordingly it would be desirable to have a Hall effect current sensing system that tends to have improved accuracy, and has improved immunity to interference.

SUMMARY

The following presents a simplified summary of the disclosure in order to provide a bask understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

The present example provides nonintrusive current measurement in an environment with external magnetic noise. The examples may utilize unique Hall effect sensors and a mechanical structure to provide measurements that may be processed to eliminate distortion or noise from the desired current measurement signal.

The mechanical configuration of the sensor may include a U-shaped structure. The U-shaped structure includes two legs or uprights of the U-shaped structure through which electrical current flows in each leg. Current in a first leg flows in the opposite direction to current in its adjacent second leg.

Multiple Hall Effect current sensor elements may be placed on the legs or uprights of the U shaped structure. The sensors may be coupled to a logic device programmed utilizing a process that determines the actual current based on the outputs of the Hall effect sensors. Utilization of this current measurement sensor may mitigate external magnetic noise from distorting the current measurement in the desired circuit.

The present examples can significantly improve the accuracy of current measurement in the presence of other magnetic fields by measuring the contribution of noise and canceling its effects on the current measurement. In particular the examples provided can allow accurate current measurement of current flowing in in circuit structures such as a bus bar, while significantly reducing the weight and size of existing high noise immunity, non-intrusive current measurement solutions.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
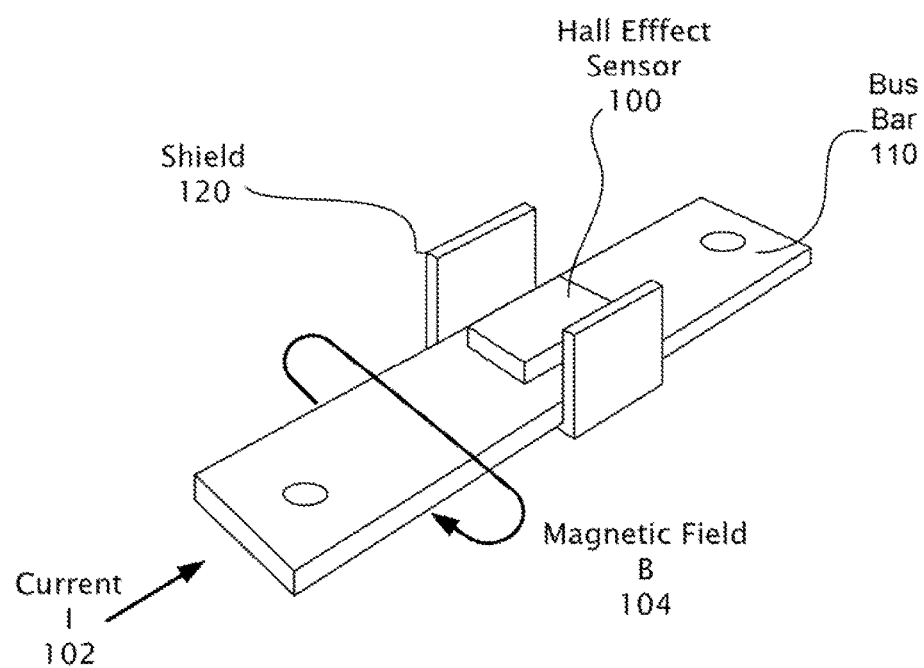
FIG. 1 illustrates a typical bus bar current measurement system with a shield.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

The present invention provides nonintrusive current sensing technology where multiple high power current conductors in close proximity can influence the accuracy of the individual conductor/sensor current measurements due to the magnetic field generated by each of the conductors The examples below describe a current measurement sensor system and a process for using it to produce accurate current measurements in the presence of electrical interference, or noise. Although the present examples are described and illustrated herein as being implemented in an aircraft power distribution system, the system described is provided as an example and not a limitation. As those skilled in the art will appreciate, the present examples are suitable for application in a variety of different types of current measurement systems including an exemplary current sensor device ("CS"), a current sensor and contactor control device ("CCS"), and other applications.

For example in a broad sense the present invention may be used in vehicle power distribution systems where attaining accurate current measurements, and size and weight of the measurement device can be critical. Particularly the present invention may be useful in measuring bus bar current between contactors of a power distribution system.

The present invention tends to improve the measurement accuracy of a Hall effect sensor in a magnetically noisy environment. In the examples provided herein, two or more Hall effect sensors are disposed in a mechanical assembly and disposed in a configuration such that the Hall Effect sensors detect magnetic fields generated by adjacent conductors (unwanted distortion) and the desired current to be measured. The examples also utilize unique a unique processes to eliminate the unwanted distortion from the measurement, producing a value for the desired measured current that tends to be more accurate than currently available. Accordingly the system and method disclosed herein may be used to measure current accurately in noisy environments, or environments where a more accurate current measurement is desired.

Nonintrusive current measurement may utilize Hall effect sensors. Hall effect sensors measure the magnetic field around the current carrying conductor. A principal drawback of Hall effect sensors is the external magnetic fields that distort the current measurement. External stray magnetic fields are generated for example from electrical currents flowing in nearby conductors. Several methods have been used to minimize the effect of the external magnetic field on the sensor measurements.

First, using shielding material to block the external field from around the current measuring sensor is one possibility. However this method is somewhat cumbersome, as providing a shielding material tends to be a customized instillation.

Second, placing nearby conductors perpendicular to, and far away from the plane of the Hall effect sensor has been attempted. This type of alignment and placement may help reduce the effect of the external magnetic noise because of reduced strength of the interference is realized as distance is increased, and also minimization of the interfering magnetic field at any distance tends to be reduced by orienting the measurement device ninety degrees to the interfering conductors. This technique may require a lot of room to implement successfully. Unfortunately as circuit sizes become more compact in modern electronics this type of measurement configuration tends to be impractical. And finally, multiple sensors may be utilized in a differential configuration in an attempt to cancel the external magnetic field noise. Differential measurement techniques in general tend to reject noise from measurements, however when applied to Hall effect sensors, this technique may prove unsatisfactory to produce improved accuracy in current measurements.

Figure 2:
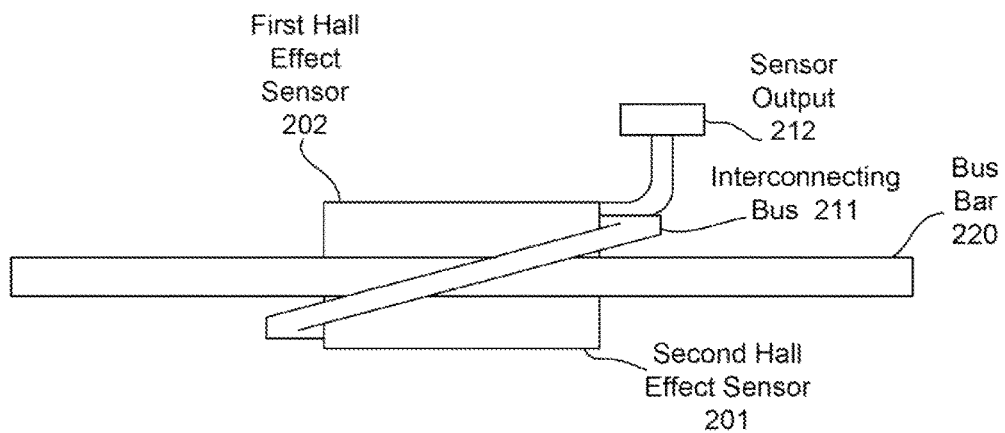
FIG. 2 illustrates a typical bus bar current measurement system having Hall effect sensors set up for differential measurement.
Figure 3:
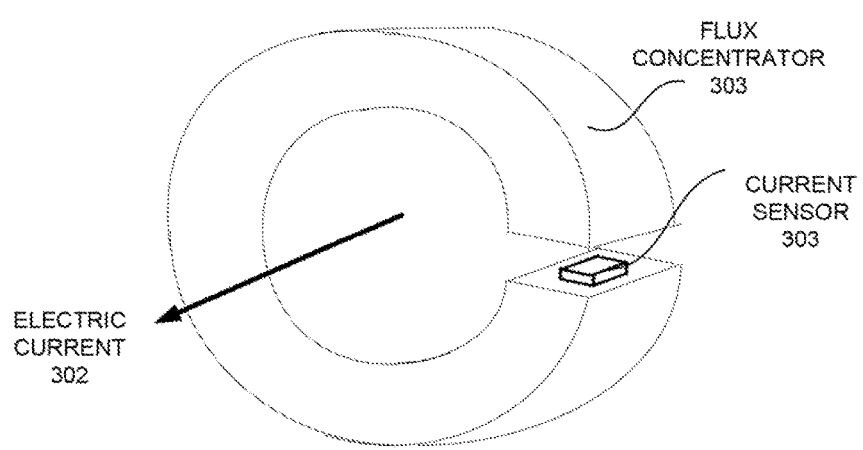
FIG. 3 illustrates another conventional Hall effect current measurement system that tends to be less invasive than the previously described configurations.

FIGS. 1-3 show some standard ways of measuring current that are typically inferior in reducing distortion in a current measurement as compared to the present invention, and otherwise less suitable for use in noisy environments that the present invention may be successfully used in. In particular the available high power current sensing devices such as these that are used in the aircraft industry tend to be heavy, occupy a large volume and their measurements of current are effected by magnetic fields generated by adjacent high power conductors FIG. 1 illustrates a typical bus bar current measurement system with a shield. The typical Hall effect sensor 100 is placed directly above a bus bar 110, but is not electrically connected to the bus bar. The magnetic field 104 generated by current 102 flowing in the bus bar. The sensor 100 may be contactless and is configured to convert the magnetic field 'B' to a Hall voltage output (output leads from Hall effect sensor not shown) proportional to the current 'I' flowing in the bus bar.

The device 100 may be shielded from external magnetic field interference by a shielding wall 120 that typically does not enclose the entire device 100. Although the shielding wall blocks some of the external magnetic noise, the Hall voltage output of the contactless current sensor will typically be significantly distorted by an external magnetic noise. External magnetic noise can be generated by nearby bus bars and or contactor energizing.

FIG. 2 illustrates a typical bus bar current measurement system having Hall effect sensors set up for differential measurement. Two Hall Effect sensors 201, 202 are placed on opposing sides of a bus bar 210. An interconnecting bus 211 feeds output of sensor 201 to sensor 202, which then outputs a differential output of the two sensors to an output connector 212. This differential measurement seeks to cancel out external magnetic fields, and tends to work if the external magnetic field is uniform and homogeneous. However this is not the case in many real world current measurement environments.

FIG. 3 illustrates another conventional Hall effect current measurement system that tends to be less invasive than the previously described configurations. However, in this configuration the circuit tends to be more susceptible to noise, as the sensor 303 tends to not be in as intimate contact with the current being measured 302. In the instant configuration a flux concentrator 303, may be shaped to concentrate the magnetic flux so that it flows through a Hall effect sensor 303. Current 302 typically flows in a conductor passing through a cavity in the flux concentrator 303, and the magnetic flux produced travels through the ferromagnetic (typically ferrite) material and into the sensor 303. The concentrator may be split as this configuration is often used in instrumentation, such as in clip on current probes and the like. However this arrangement must often have an offset current calibration performed, and have the unit de-Gaussed in order for it to provide suitable current measurement results. Accordingly there is room for improvement in the previously described current measurement techniques.

The current measurement system described herein includes an electric current measuring device that includes the mechanical structure of a power conductor and an array of Hall effect sensors to accurately measure current flow. Accuracy is achieved by cancelling the effects of static and/or dynamic magnetic noise impinging on the sensor and the conductor carrying the current being measured from adjacent power devices. Exemplary interference includes ringing generated from the switching of power coils, magnetic noise generated by adjacent high power conductors, and the like.

The Hall effect sensors are arranged in an array and mounted on the mechanical structure to measure the electric field around the conductor. The sensor array detects the combined magnetic field generated by the current running through the conductor and the contribution of any other magnetic fields generated by other power conductors. Noise elimination may be achieved by the unique Hall effect sensor system's unique configuration, and by utilizing unique processing of the measurements to determine the actual current through the conductor, by measuring and subtracting external noise from the measured current that includes the noise contribution of adjacent conductors.

The present current sensor and system may advantageously be utilized in high power DC or AC contactors utilized in the industrial and aviation technology. In particular, the current sensing device system may be used to perform other power related functions such as: bidirectional short circuit detection and protection, current and voltage reporting, contactor on/off control based on discrete input or data received from serial busses, built in test, and the like.

There are two exemplary types of current sensors described herein: the standalone current sensor ("CS") and the contactor/current sensor combination ("CCS") in which the current sensor measures current and has the ability to open and close the contactor and disconnect the power source when shorts are detected.

Figure 4:
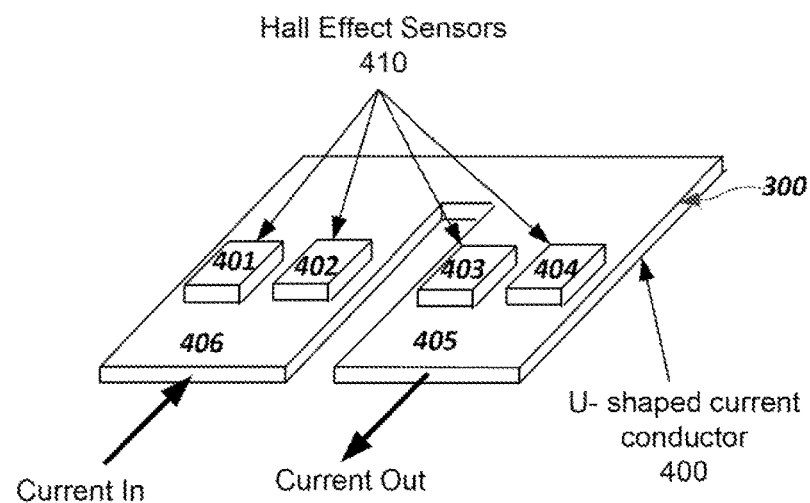
FIG. 4 illustrates a mechanical configuration of an example of the unique current sensor system in which an array of Hall effect sensor may be disposed in a U-shaped current conductor such that distortion may be reduced.

FIG. 4 illustrates an example of the unique current sensor system 412 in which an array of Hall effect sensors 410 may be disposed in a U-shaped current conductor 400. This standalone current sensor ("CS") may include Hall effect sensors and logic device (for example a microcontroller) that are mounted on a U shaped copper, or equivalent material, conductor 300. Hall effect devices 301, 302, 303 and 304 may be disposed on the conductor as shown. Other components, such as the microcontroller (or equivalently analog logic) are not shown in the figure for clarity. Also any potting or coatings that may be advantageously utilized in alternative examples are also omitted for clarity.

The unique shape of the U-shaped structure's 400 provides cancellation of the magnetic field generated by the current flowing through it—essentially by providing a conductor with a bend in it, or otherwise providing a conductor shape such that the current flows in opposite directions to each other in adjacent paths, or conductors. The magnetic fields generated by currents flowing in opposite directions substantially cancel out between the parallel legs. By canceling the magnetic field generated by the current flowing through the conductor which is the current that one desires to measure, one can measure the induced magnetic field, or interference that is generated by adjacent conductors.

The U-shaped structure 400 and has legs 405 and 406. The structure 400 may be constructed from any convenient ferromagnetic material such as iron, ferrite or the like. The U-shaped structure 400 is typically symmetric from side 405 to side 406, and may take the form of a substantially flat plate with a notch of suitable width cut into it to direct current flow, so that current applied on one side flows in a first direction in one leg of the U 405. At the base of the U, the current changes direction and flows out into leg 406 parallel to the other leg of the U, and in a second opposite direction. The shape of the piece 400 need not be exactly as shown, as any other sort of regular shape that provides a change in direction of the current so that parallel conductors with equal currents in opposite directions are created. From one side to the other of the conductor symmetry should be provided so that the currents may take advantage of the geometry to produce equal and opposite fields about same so that they will cancel out.

Multiple Hall effect sensors 410 are used to determine whether the calculated noise should be added or subtracted from the measurement of the Hall effect sensor that is used to determine the current flowing through the U-shaped conductor.

Any device capable of producing a signal utilizing the Hall effect may be utilized. Semiconductor Hall effect sensors may be utilized in this application. A semiconductor Hall effect device may be made from an indium compound semiconductor crystal such as indium antimonide, mounted on an aluminum backing plate, and encapsulated with other electronics or by itself. The aluminum backing plate or other suitable mounting surface provided on the sensor may be coupled to a ferromagnetic material or ferrite to improve its performance. Connecting leads from the IC can be coupled to other circuitry as desired. Conventionally constructed integrated circuits containing a semiconductor Hall effect sensor may advantageously be utilized in this application. Such Hall effect sensors may contain both the sensor plus a high gain integrated circuit amplifier in a single package, along with other ancillary circuitry that may be useful such as an analog-to-digital converter, I²C (Inter-integrated circuit communication protocol) circuitry for direct connection to a microcontroller's I/O port, and the like (for example CAN circuitry).

On the first leg 406 Hall effect sensors 401, 402 are disposed. On a second leg 405 Hall effect sensors 403, 404 are disposed on the plate. Hall effect sensors 401, 402, 403, 404 measure substantially the same currents in their respective legs however they are opposite in sign and tend to cancel out when summed leaving the distortion component being measured. The Hall effect sensors 410 may be provided with external connections so that they may be coupled to associated circuitry to process their signals so that the distortion in the measurement may be removed.

Figure 5:
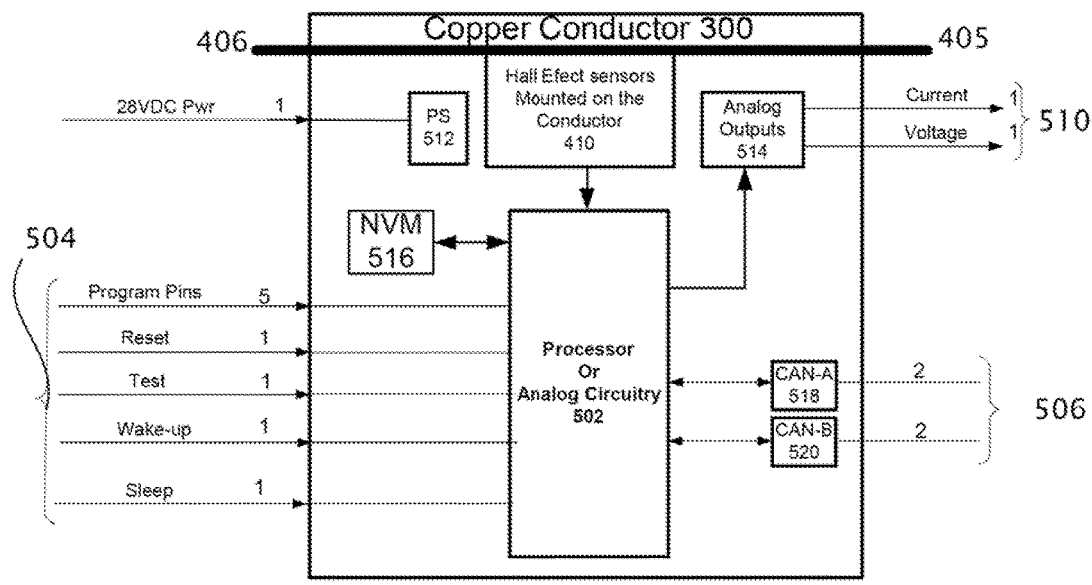
FIG. 5 is a block diagram of the example of the unique current sensor system in which an array of Hall effect sensor may be disposed in a U-shaped current conductor such that distortion may be reduced.

FIG. 5 is a block diagram of the example of the unique current sensor system 412 in which an array of Hall effect sensors may be disposed in a U-shaped current conductor such that distortion may be reduced. The current sensor 412 may include a copper conductor 300 and having a current input 406 and a current output 405. The current sensor 412 produces analog current and voltage outputs 510 representative of the current at the current input 406.

The sensor 412 couples to a bus, here shown as a dual can bus 506. The bus couples via two wires to a CAN-A typical bus interface circuit and by a second pair of wires to a typically constructed CAN-B bus interface circuit 520. Alternatively an Inter-Integrated Circuit ("I2C") bus may be utilized, or another equivalent bus structure. Interface circuits CAN-A 518 and CAN-B 520 couple to the processor 502. Power may be supplied to the system from an external supply such as an exemplary 28 V DC supply 508 coupled to a regulator 512 which supply various circuits in the system 412. Power may also be provided through the contactor command input in the CCS (meaning that in such an application the 28 Vdc power input may not be necessary).

Data acquisition and reporting may be facilitated by the bus structure. The CS or CCS reports internal data via analog outputs and via the serial busses. This data is used for various purposes such as control and maintenance by the external control systems The CS or CCS reports the following data on its analog outputs: Sensor Current (positive and negative flow), and Input voltage. The CS or the CCS reports the following data on the serial busses: sensor current (noise is cancelled), voltages (AC or DC—These parameters are passed to the cockpit for display on the synoptic page to provide the pilot with a complete status of the electrical system.), sensor average Current, sensor peak current, sensor minimal current, sensor contacts needing service due to increase in the voltage drop across the contactor, contactor On/Off status, BIT failed, contactor failed, and other internal parameters. Additionally the CS or CCS can also take in a ground/open discrete input and pass it on the higher level control systems. In this regard, the CS or CCS are acting as a data acquisition system, especially when multiple sensors are used in the primary power distribution system. Also, a ground/open output that can be included and used for control.

The system 412 includes a micro controller, that may be onboard or off, and may include a memory and any other conventional components needed to function properly. Coupled to processor 502 are data inputs 504 may include program pins, a reset input, test input, wake up inputs, sleep inputs, or the like. Nonvolatile memory ("NVM") 516 is conventionally constructed and coupled to processor 502.

Processor 502 receives inputs from Hall effect sensors mounted on the conductor 410. In addition to current measurement, Hall effect sensors 410 may also include temperature sensing and measurement capabilities. The Hall effect sensor outputs may be coupled to the processor 502. The Hall effect circuit 410 may include an analog to digital converter to produce a signal compatible with the processor 502. Processor 502 produces a representative digital signal which is coupled to analog output module 514. Analog output module 514 may include a digital to analog converter, amplifier and various protection or buffering circuits to convert the digital output from the processor to analog current and voltage signal's 510. Alternatively the processor may provide a digital output instead of the analog output.

Wake-up and Sleep Modes for the CS or the CCS may be included as two analog ground/open discrete inputs: Sleep and Wakeup inputs. These inputs are used if the sensor is constantly powered by an external power source if the sensor is constantly powered, the se inputs can be used to activate the sensor when the aircraft (or equivalently other system such as UAVs, ships, trains, or the like) is operational, thus, allowing it to draw power from the battery bus only when required. The sensor can transition to the sleep mode (very small power consumption) when the analog sleep command is asserted or when a sleep command is received through the serial bus interfaces. The CS or CCS transitions to the active mode when power is applied or when the wake-up input is asserted.

Figure 6:
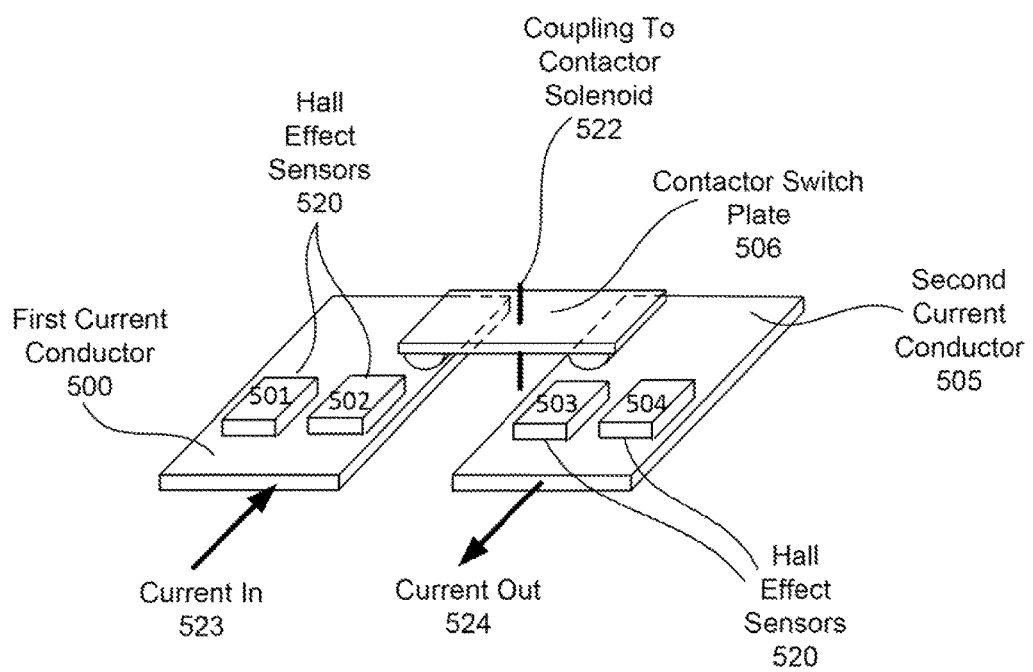
FIG. 6 illustrates a mechanical configuration of an alternative example of the unique current sensor system of a power contactor in which an array of Hall effect sensor may be disposed in a U-shaped current conductor such that distortion may be reduced imbedded in a power contactor.

FIG. 6 illustrates a mechanical configuration of an alternative example of the unique current sensor system of a power contactor in which an array of Hall effect sensor may be disposed in a U-shaped current conductor such that distortion may be reduced imbedded in a power contactor 528. Note that the contactor closing mechanism (the electric Switch) is placed between the legs of the mechanical U structure. A contactor is a high power electrically controlled switch often used for switching a power circuit. A contactor is similar to a relay except it typically has a higher current rating. A contactor may be controlled by a circuit which has a much lower power level than the switched circuit. Contactors can come in many forms with varying capacities and features. It may be desirable to know the current levels, either going into or out of a contactor being used in a power distribution system. The contactor/current sensor includes Hall effect sensors and logic device (microcontroller) and the contactor coil driver. The electronics are mounted on a U shaped copper conductor as shown.

For simplicity the diagram omits the coil, base and other conventional components of a contactor. The diagram shows the coupling or plunger 522 that is actuated by the contactor coils so that the contactor switch plate 506 either contacts the current conductors 500, 505, or is disengaged from it interrupting power. The contactor may be a normally open, normally closed, or other equivalent configuration.

A configuration of the U-shaped mechanical structure and current sensing is incorporated into a power contactor design as shown. The U-shaped structure's legs 500, 505, and the contactor switch plate 506 form a U-shaped structure as previously described. The structure is generally flat, and configured such that the current in 523 and current out 524 are flowing parallel to each other, but in opposite directions, as previously described. As previously noted, symmetry in the current conductors tends to promote cancellation.

A plurality of Hall effect sensors 520 may be disposed on a planar surface of the U-shaped mechanical structure. First current conductor 500 includes two hall effect sensors 501, 502. Second current conductor 505 includes a second pair of Hall effect sensors 503, 504. In alternative examples differing numbers of Hall effect sensors may be equivalently used.

Although not shown in FIG. 4 or 6, the current measurement system may be shielded by a shielding element similar to that shown in FIG. 1 to improve accuracy. The shielding element can be made of ferromagnetic material (i.e. Fe—Si or Ni—Fe). The shielding element tends to block the majority of external magnetic noise from distorting the measurements and therefore further improves the noise immunity of the present examples. In addition to blocking the external magnetic noise, the shielding element can act as a magnetic field concentrator. The ferromagnetic properties of the shielding element attract the magnetic field and concentrate the magnetic field to pass through a specific area. When the Hall effect sensor is placed in a specific area where maximum amount of the magnetic flux pass through it, the sensitivity of the Hall effect sensor is effectively increased.

Figure 7:
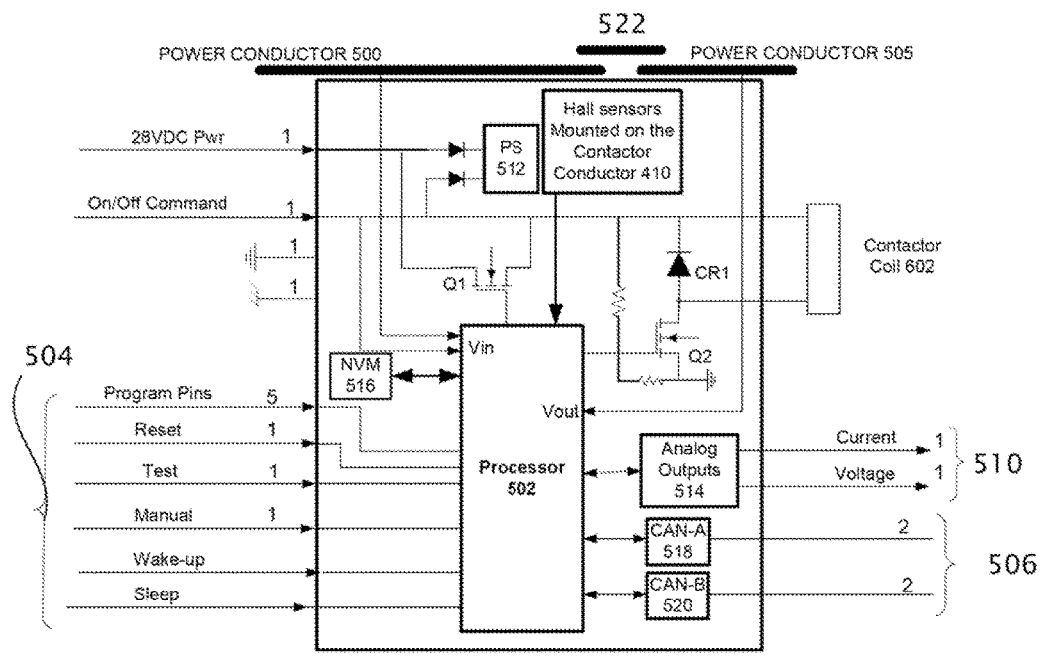
FIG. 7 is a block diagram of the alternative example of the unique current sensor system of a power contactor in which an array of Hall effect sensor may be disposed in a U-shaped current conductor such that distortion may be reduced imbedded in a power contactor.

FIG. 7 is a block diagram of the alternative example of the unique current sensor system of a power contactor in which an array of Hall effect sensor may be disposed in a U-shaped current conductor such that distortion may be reduced imbedded in a power contactor. The current measurement system also provides functionalities including I2T protection, contactor control, and communications capabilities with external electrical system hardware. The figure shows the electrical connections as may be utilized with the current measurement sensor previously described (412 of FIG. 5). The current sensor outputs voltage and current measurements through analog outputs 510 and through serial CAN busses, or their equivalent. Power flowing through the power conductors 500, 505 may be interrupted by the contactor switch plate 522. It is activated via the "on/off command" line which includes optional diode CR1 to prevent back switching EMF across contactor coil 602. Transistors Q1, Q2 and their associated circuit are conventionally constructed to provide ampere squared times seconds ("I2T") thermal protection. Activation of contactor coil 602 opens and closes the contactor switch plate 522.

The CS or CCS device is designed to include a control circuit that is capable of activating/deactivating a power contactor. The Current sensing device receives the contractor command from a hardwired analog input generated by an external control system, or from the serial bus inputs. Based on the command, the contactor coil is energized or de-energized.

The command in the CCS configuration is independent of the logic devices that are used to determine the current in the sensor, meaning that the loss of the sensor electronics will not affect the activation or deactivation of the contactor.

Since multiple sensors can be used in a single enclosure, each sensor may be assigned a special designator through ID pins (identity, or program pins 504) to differentiate its output from other sensor outputs on the serial busses 506. The sensors in the CS (412 of FIG. 4), and CCS modules (528 of FIG. 6) are activated and measurements made according to a process that reduces distortion, improving accuracy of the measurement. In addition to the process that improves accuracy the contactors (528 of FIG. 6) and current sensors (412 of FIG. 4) may include a process that provides for sensor/contactor integration in power distribution systems.

The logic device 502 is mathematically programmed according to a process to calculate the actual current flowing through the conductor based on the following equation:

$$I_{actual} = I_{measured} +/- I^{noise} \quad (1)$$

Where: $I_{actual}$ is the current flowing through the conductor without the effects of noise from other devices. $I_{measured}$ is the current measured from first Hall sensor #1 or a second Hall sensor #2.

$$I_{sense1} = I_{actual} +/- I_{noise} \quad (2)$$

$$I_{sense2} = -I_{actual} +/- I_{noise} \quad (3)$$

Adding equations 1+2 results in $$I_{noise} = (I_{sense1} + I_{sense2})/2 \quad (4)$$

Where $I_{sense1}$ and $I_{sense2}$ are known, therefore, $I_{noise}$ can be determined from equation 4

Once the value of the $I_{noise}$ is determined, the noise is either added to or subtracted from the current measurement of the Hall effect sensor depending on whether the noise is received from the left or the right side of the U-shaped mechanical structure.

Figure 8:
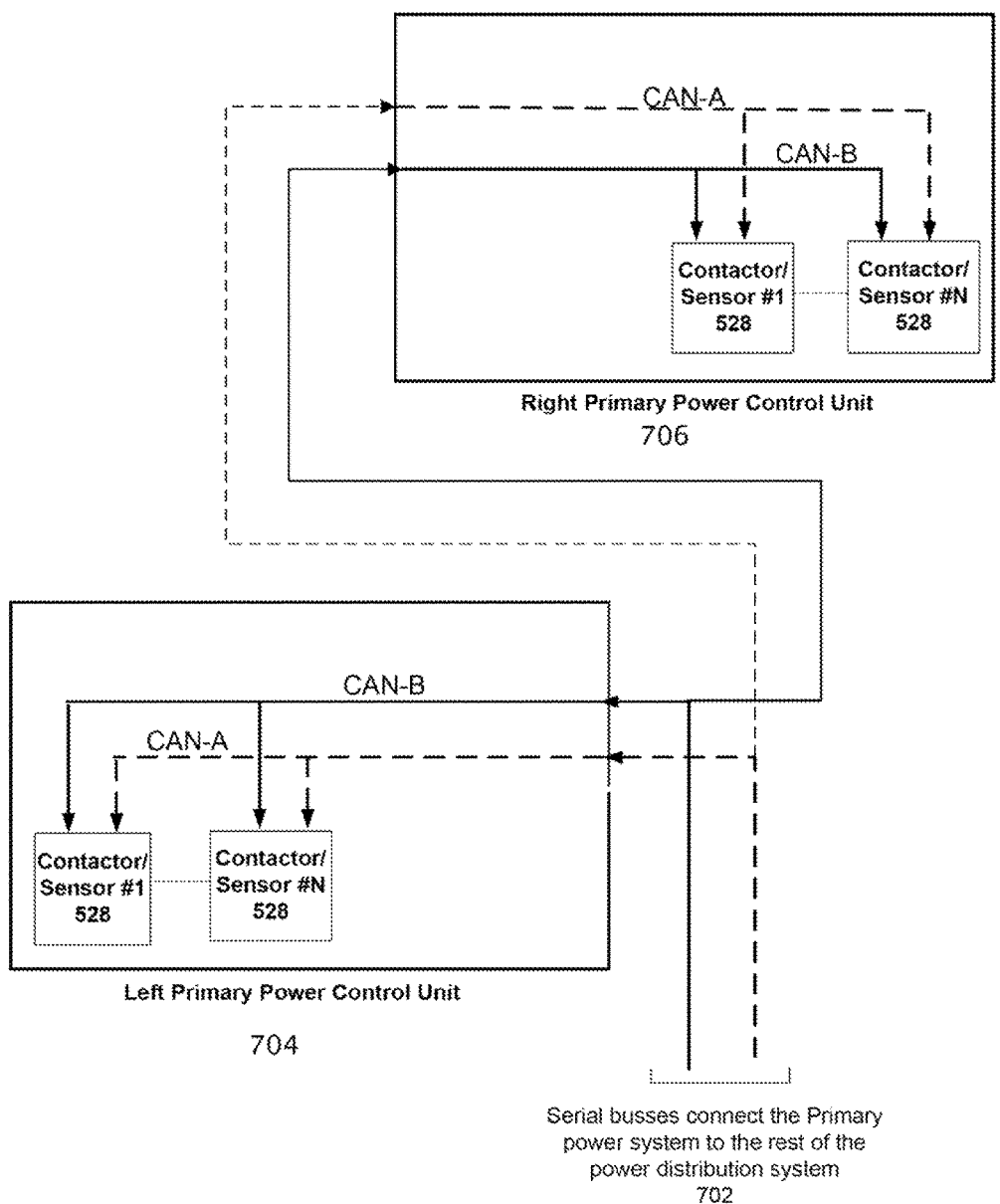
FIG. 8 is a general block diagram of an aircraft power distribution system utilizing the unique contactors with current sensors described herein.

The exemplary current sensor is also designed to close an external power contactor upon receiving an on/off command from the system received through the analog or digital inputs of the system. When overcurrent is detected, the logic device within the current sensor releases (opens) the external power contactor to protect the rest of the circuitry from a potentially harmful short circuit current surge. FIG. 8 shows the current sensor invention as part of a larger power distribution system.

An I2T algorithm is used to detect and protect against short circuits. This algorithm employs a combination of current and voltage to detect a short circuit or an increase in the load current beyond the normal limits of operation. The algorithm includes protections to prevent nuisance trips. This algorithm improves on the operation of thermal circuit breakers and allows for tighter margins to minimize the loss of power under short circuit conditions.

The logic device calculation may be programmed to detect overcurrent in the bus bar wherein the threshold for overcurrent may be defined by an I2T function. The I2T function is calculated as a product of the square of the current and time. Overcurrent detection provides short circuit protection for any external elements fed by the bus bar.

The calculated I2T value is compared to another computation that incorporates the measured voltage and current behavior in accordance with Ohm's law. This check is accomplished to avoid nuisance releases of the external power contactor.

The response time of the current sensor invention to shorts can be programmed to incorporate a delayed response when external shorts are detected. This feature allows a system of contactors and current sensors connected in series to respond to a short circuit by releasing first the contactor that is closest to the short as opposed to releasing all these contactors simultaneously thus causing unnecessary loss of other circuits in the system due to the loss of power.

Additional variables such as ambient temperature are implemented in to the algorithm to further improve the accuracy of the final calculated current.

FIG. 8 is a general block diagram of an aircraft power distribution system utilizing the unique contactors with current sensors described herein. In this power distribution system serial busses 702 are coupled to a right primary power control unit 706 and a left primary power control unit 707, in parallel. The bus 702 in each power control unit 704, 706 couples to controllers having an "CAN-A" channel 708, and a "CAN-B" channel 710. The CAN buses internal to the power control units 704, 706 couple the controller redundantly to one or more contactors 528.

Figure 9:
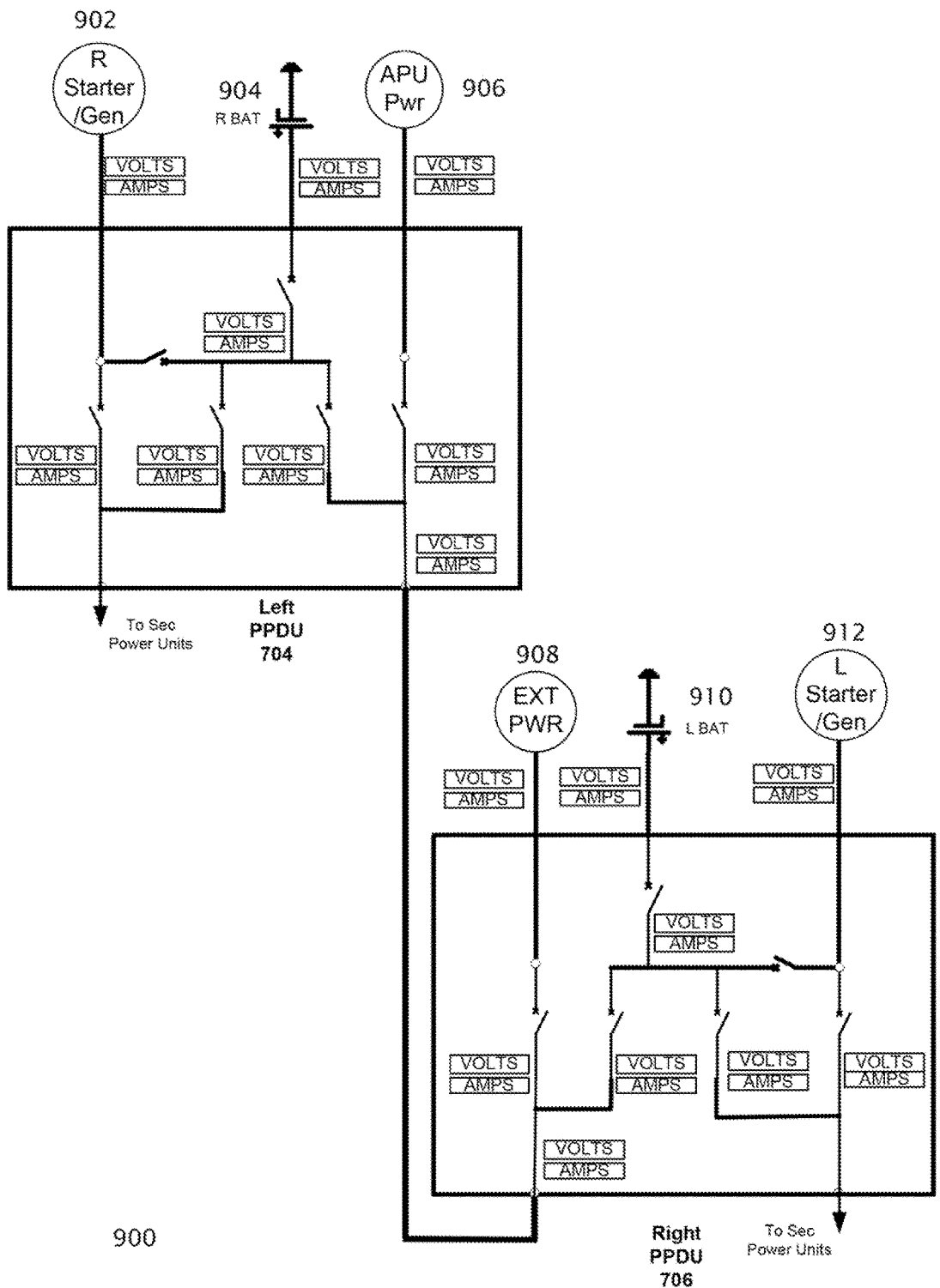
FIG. 9 is a block diagram of an exemplary aircraft primary power distribution system showing locations where the unique power contactors may be utilized to provide voltage and current measurements.

FIG. 9 is a block diagram of an exemplary aircraft primary power distribution system showing locations where the unique power contactors may be utilized to provide voltage and current measurements. In such a system the unique contactors (528 of FIG. 6) may be advantageously employed to apply various power sources 902, 904, 906, 908, 910, 912 in a right and left primary power distribution unit ("PPDU") 704, 706 as show at the various switch contacts. The exemplary contactors also provide measurement of current and voltage at the locations marked "volts" and "amps".

Primary power distribution systems in most aircrafts are contained in an enclosure that hosts several high power conductors. The pilot must know, through the synoptic display, the status of the primary power distribution system by monitoring the current flow and voltages of the primary power consumers in the aircraft. The primary power consumers can be electrical busses or high power loads in the aircraft, The figure shows a typical synoptic display of the primary power distribution, and the related key parameters that a pilot might want to see. Upon receiving alerts that indicate that there are issues with the electrical system, the electrical power distribution system or the pilot can take the appropriate action based on the voltage and current readings to isolate these problems and to continue safe flight.

Figure 10:
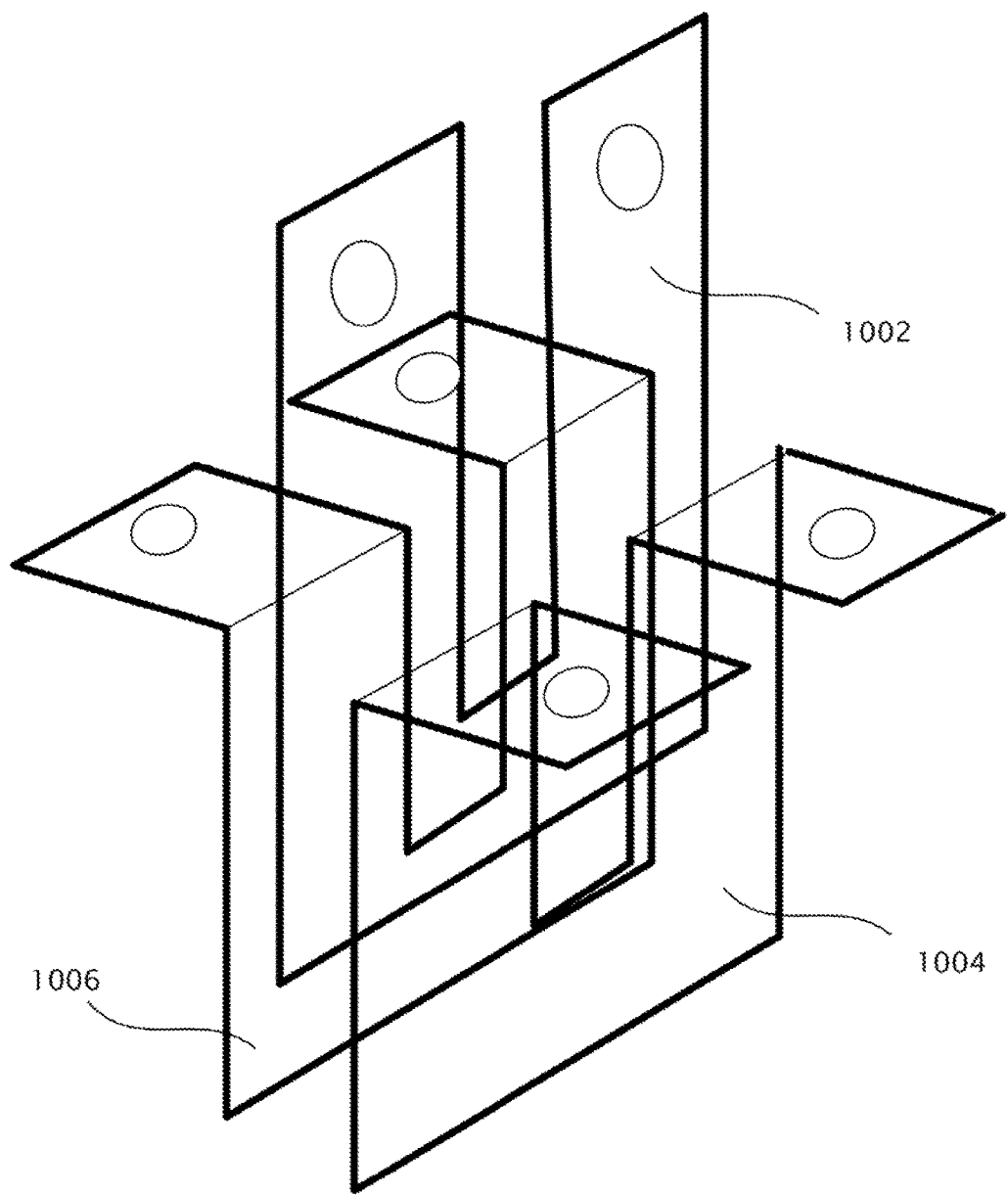
FIG. 10 is a mechanical diagram showing the configuration of current conductors utilized in a compact three phase power sensors.

FIG. 10 is a mechanical diagram showing the configuration of current conductors utilized in a compact three phase power sensors 900. A first power phase may travel through a first sensor 1002. A second power phase may travel through a second sensor 1006. A third power phase may travel through a third sensor 1004. Alternatively this conductor arrangement may be used in three phase power contactors as well. The configuration tends to be compact, as well as having improved accuracy.

Figure 11:
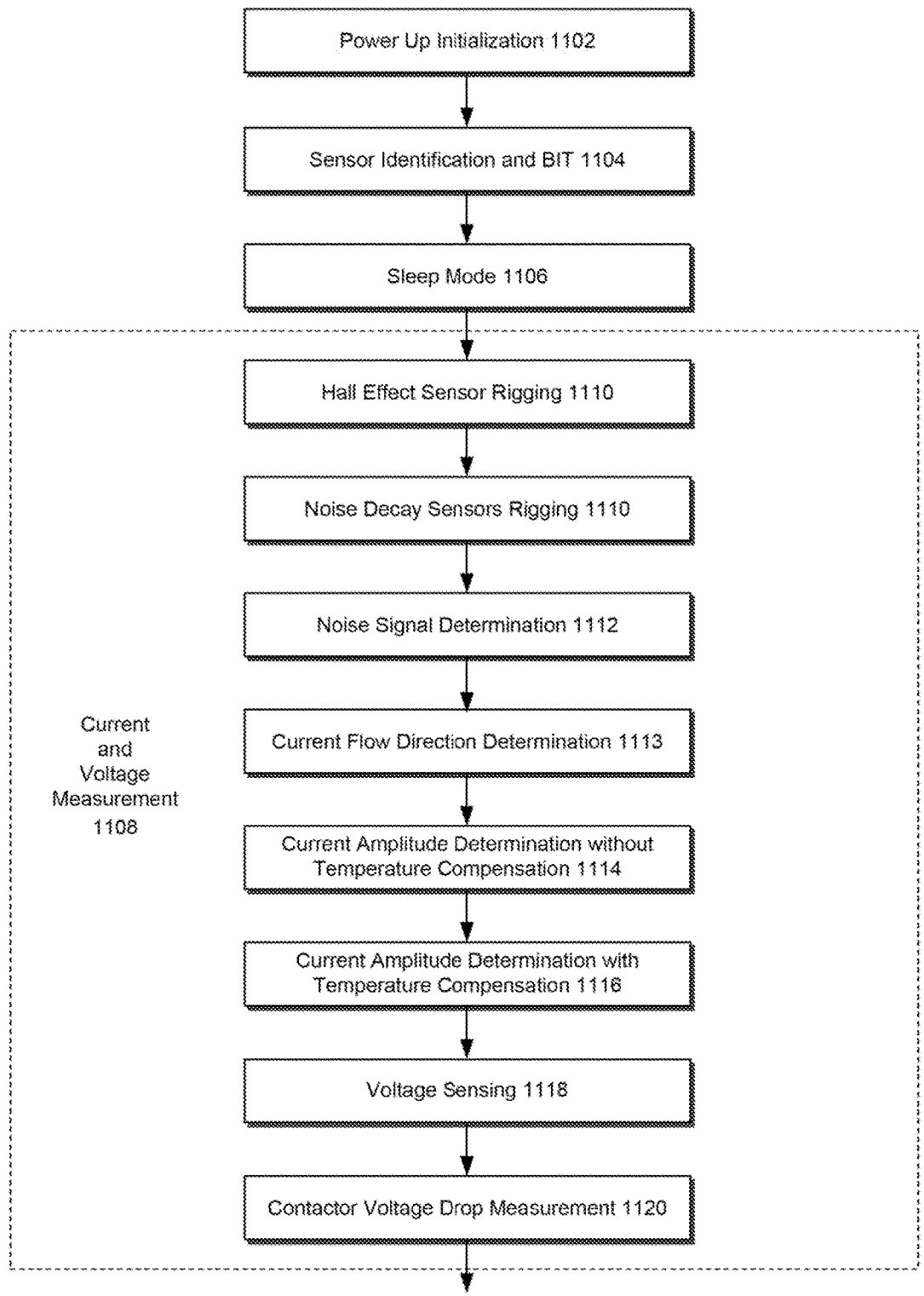
FIG. 11 is a block diagram showing a process for operating the exemplary current sensor.

FIG. 11 is a block diagram showing a process for operating the exemplary current sensor. The process shown and sub-process thereof may be utilized in operating CS and CCS modules, either alone or in a power distribution system.

At block 1102 a power up initialization process may be performed. The CS or CCS microcontroller may become active (power-up) when power becomes available. Power can become available to the sensor in two ways: the power input to the sensor receives 28 Vdc, power is applied through the "contactor on command" or other equivalent methods. In the case when power is constantly connected to the sensor, the CS or CCS microcontroller may become active (powered-up) when the "wakeup" input is asserted (Wake-up input transitions to 28 Vdc).

At block 1104 sensor identification and built in test ("BIT") processes are performed. Various conventional methods for identifying a component may be utilized in the sensor identification process. Upon power-up, the sensor performs BIT prior to providing current and voltage measurement computations. This is done so that the CCS or CS can check its circuitry before providing current or voltage measurements to the system, or commanding the contactor provided that the Contactor command is in the off state.

Also upon power-up and prior to performing BIT when the contactor is commanded on, the CCS can disable the contactor (for example, by opening the ground return of the coil). This may be done if the current measurement indicates that a short is detected to protect the system from damage. BIT in this case is performed only after the CCS indicates that a short is not detected.

A sensor identification process is performed to identify the sensor to the system in which it is being used. Upon first time power-up, the CS or CCS may configure its CAN bus identities based on hard wired program pin data (or sensor ID data) and store the program pin data in non-volatile memory ("NVM"). In addition the CS or CCS may detect unsanctioned program pin configurations of the hardwired program pin data or the NVM program pin data so that program pin data corruption must be detected.

The CS or CCS may utilize the hardwired program pin data if a miss-compare is detected between valid program pin data and the NVM program pin data. And, the CS or CCS may be disabled if the hardwired program pin data and the program pin data and the NVM program pin data are invalid.

At block 1106 a sleep mode is provided. The CS or CCS processor can transition to an inactive state (sleep mode) if the analog Sleep input is asserted or if a sleep command is received via CAN. This may be provided when the CS or CCS may receive power from the aircraft batteries. To conserve power, the CS or CCS processor may be deactivated.

At block 1108 a current and voltage measurement process may be provided that includes such sub processes as hall effect sensor rigging 1109, noise decay sensor rigging 1110, noise signal determination 1112, current flow direction determination 1113, current amplitude determination without temperature compensation 1114, current amplitude determination with temperature compensation 1116, voltage sensing 1118, and contactor voltage drop measurement 1120.

Hall effect sensor rigging is performed at block 1109. Upon power up, the CS or CCS utilize the offsets stored in NVM to correct each of the Hall Effect sensor input data.

The Hall Effect current sensors data rigging may be accomplished in the factory. A known current may be conducted through the current sensor to determine the Hall Effect sensors offsets to be used in calibrating the CS or the CCS. The voltage offset of each of the sensors may be recorded into NVM. In addition, the CS or CCS can be capable of detecting if the offset data stored in NVM is corrupted, and the CS or CCS may declare itself failed if the NVM data is corrupted.

Noise decay sensor rigging is performed at block 1110. Upon power up, the CS or CCS may utilize the noise decay offsets stored in NVM to correct each of the Hall Effect sensor input data. The Hall Effect output offsets are used to determine zero current flow. This data is used to determine the noise decay over the various sensors.

Noise from a noise source decays over traveled distance. Therefore the impact of noise on the sensors in one leg is not the same as the other due to the difference of distances from the noise source. Noise decay rigging may be accomplished in the factory. A known electromagnetic noise of a set amperage is radiated from a predetermined distance from the left to the right and vice versa with no current flowing through the sensor. The offsets of each of the sensors are recorded in the NVM. This data is used in the current noise cancellation process The CS or CCS shall be capable of detecting if the offset data stored in NVM is corrupted, as failure of the offset data could affect the current measurements. The CS or CCS can declare itself failed if the decay pattern is not reasonable due to faults. Also, the CS or CCS may declare itself failed if the NVM data is corrupted.

Noise signal determination is performed at block 1112. The pattern of the noise is used to determine if the noise is to be added or subtracted from the current measurement. The CS or CCS may set the noise to subtract from the measured current of the input leg, if the current flow is positive and sensor 401 of FIG. 4 is greater than sensor 404 of FIG. 4 provided that the current flow is from the sensor leg 401 of FIG. 4 to sensor 404 of FIG. 4 leg.

The CS or CCS can set the noise to added to the measured current of the output leg if the current flow is positive and sensor 401 of FIG. 4 is less than sensor 404 of FIG. 4 provided that the current flow is from the sensor 401 of FIG. 4 leg to sensor 304 leg.

The CS or CCS shall set the noise to added from the measured current of the input leg if the current flow is positive and sensor 401 of FIG. 4 is greater than sensor 404 of FIG. 4, provided that the current flow is from the sensor 404 of FIG. 4 leg to sensor 401 of FIG. 4 leg.

The CS or CCS shall set the noise to subtracted to the measured current of the output leg if the current flow is positive and sensor 401 of FIG. 4 is less than sensor 404 of FIG. 4 provided that the current flow is from the sensor 404 of FIG. 4 leg to sensor 401 of FIG. 4 leg. The CS or CCS shall set the current to $(I_{302}+I_{303})/2$ if sensor 401 of FIG. 4 is equal sensor 404 of FIG. 4.

Current flow direction determination is performed at block 1113. The CS or CCS current flow may be declared positive if sensors 401 and 403 of FIG. 4 outputs are greater than 2.5 Volts. The CS or CCS current flow may be declared negative if sensors 401 and 403 Of FIG. 4 outputs are less than 2.5 Volts. The CS or CCS may be declared invalid if sensors 401 and 403 of FIG. 4 outputs not showing flow in the same direction for a specified period of time.

Current amplitude determination without temperature compensation is performed at block 1114.

Current flow in the CS or the CCS is calculated based on the following: $I_{measured}$ is the current measured from Hall sensor #302 or 303. $I_{actual}$ is the corrected current flowing through the conductor (corrected to show the amplitude without the effects of noise)

$$I_{302}=I_{actual}-I_{noise} \quad (5)$$

$$I_{303}=-I_{actual}+d*I_{noise} \quad (6)$$

Where d is the decay factor if the noise is determined to be from the positive direction. Adding equations 5+6 result in:

$$I_{noise}=(I_{302}+I_{303})/(d+1) \quad (7)$$

And where d is the noise decay which is a known quantity. Once the noise is determined, the noise is either added or subtracted from the appropriate current measurement to determine the corrected current value (noise free).

The microcontroller is programmed to calculate the actual current flowing through the conductor based on the following equation as implemented in equation 8.

$$I_{actual}=I_{measured}-I_{noise} \quad (8)$$

Current amplitude determination with temperature compensation is performed at block 1116. Look up tables can be added to NVM to provide the proper temperature compensations. The Hall effect sensor suppliers may provide these tables.

Voltage sensing is performed at block 1118, input and output voltage may be measured.

Input voltage measurement may be made by the CS or CCS microcontroller which can compute the input voltage (Vin), and output this voltage on CAN-A, CAN-B bus and on the Analog voltage output Output Voltage Measurement may be made by the CCS which may compute the output voltage (Vout) and output this voltage on CAN-A and CAN-B. The output voltage is also measured by the microcontroller.

Contactor voltage drop measurement is performed at block 1120. The CCS may compute the voltage drop across the contactor when the contactor is actuated (ON) by subtracting Vout from Vin. The output voltage is measured by the microcontroller as well. The CCS can declare the voltage drop excessive when the voltage drop exceeds a predetermined level.

Figure 12:
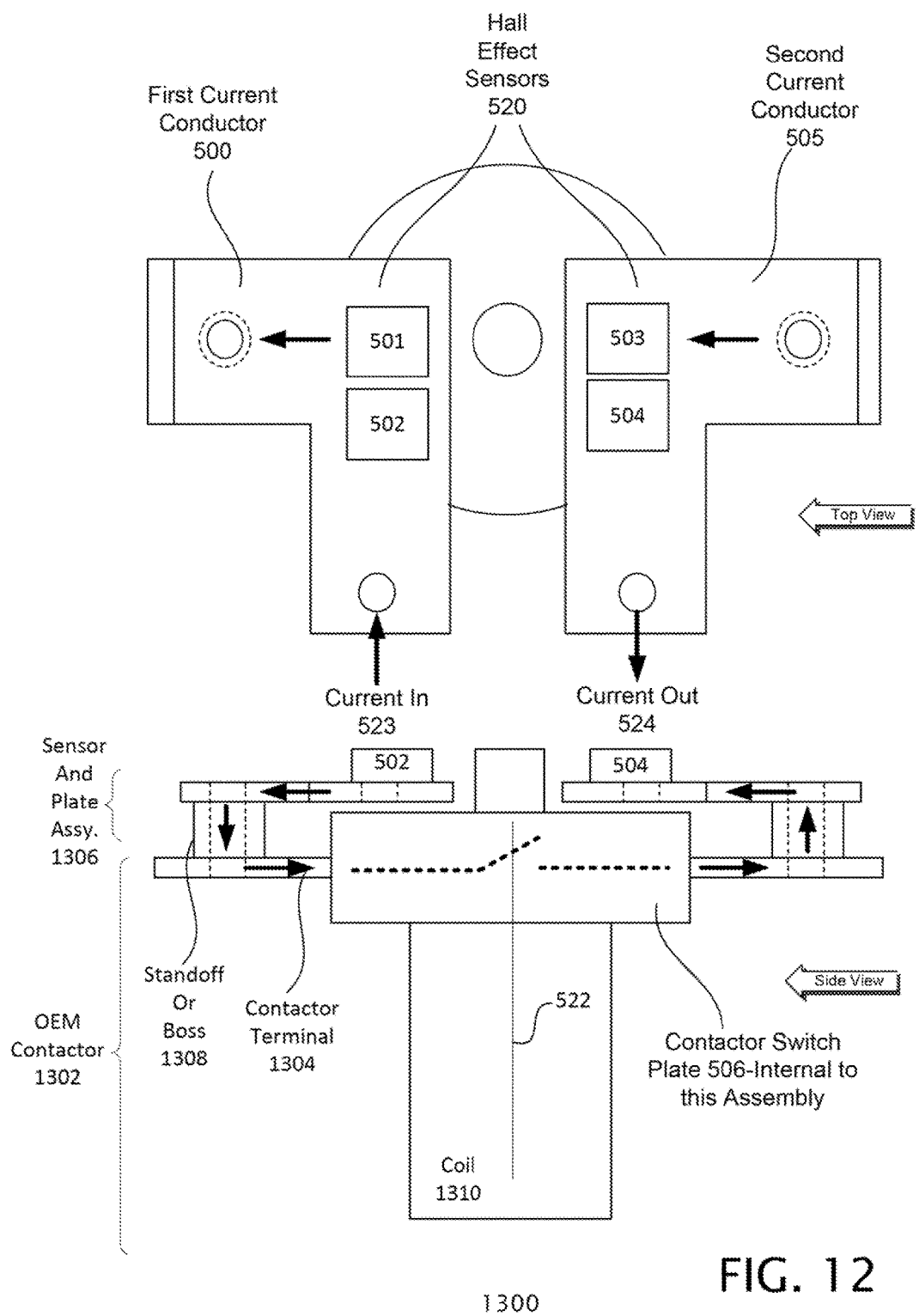
FIG. 12 is a diagram of a commercially available power contactor fitted with the unique current sensor described herein.

FIG. 12 is a diagram of a commercially available power contactor fitted with the unique current sensor described herein 1300. The assembly is shown from the side and top. Conventional original equipment manufacturer ("OEM") power contactors may be fitted with the previously described current measurement system. A sensor and plate assembly 1306 having a first and second current conductor's 500, 505 may be adapted to mount on an OEM contactor 1302. This is typically done by mounting the plate assembly 1306 to a contactor terminal 1304, typically with a boss standoff, or other equivalent mounting structure.

In the OEM contactor 1302 the integral coil 1310 actuates 522 the contactor plate assembly 506 that is internal to the contactor 1302. The plate structure directs the current so that interference is canceled and because of the mounting structure the contactor function may be maintained, even with the switch plate being internal to the contactor 1302.

An aircraft power distribution system is further described in "Aircraft Utilities and Power Distribution System" by Nehmeh, U.S. patent application Ser. No. 13/605,128, filed Sep. 6, 2012, the contents of which are incorporated herein by reference.

Those skilled in the art will realize that the process sequences described above may be equivalently performed in any order to achieve a desired result. Also, sub-processes may typically be omitted as desired without taking away from the overall functionality of the processes described above.

The invention claimed is:

1. A current measuring apparatus comprising:
a conductor mechanical structure formed in a planar U-shape such that an actual current to be measured enters into a first leg of the structure in a first direction, and exits the structure from a second leg in a second direction opposite to the first direction;
a first semiconductor Hall effect sensor, of a plurality of hall effect sensors, disposed at the first leg;
a second semiconductor Hall effect sensor, of the plurality of hall effect sensors, disposed at the second leg;
a third semiconductor Hall effect sensor, of the plurality of hall effect sensors, disposed at the first leg and side by side with the first Hall effect sensor;
a fourth semiconductor Hall effect sensor, of the plurality of hall effect sensors, disposed at the second leg and side by side with the second Hall effect sensor, and the first, second, third and fourth semiconductor Hall effect sensors are disposed in a line across the conductor mechanical structure; and
a logic device implementing a process to determine the actual current based on inputs from the plurality of Hall effect sensors coupled to the logic device.

2. The current measuring apparatus of claim 1, wherein the first leg and the second leg are disposed parallel to each other.

3. The current measuring apparatus of claim 1, wherein the conductor mechanical structure is formed in a "U" shape, such that current in a first leg of the "U" shape flows in the opposite direction of current in a second leg of the "U" shape.

4. The current measuring apparatus of claim 1, wherein the current conductor mechanical structure is a material selected from the group consisting of: copper, aluminum, tantalum, silver, gold, or platinum.

5. The current measuring apparatus of claim 1, further including a temperature sensor wherein the output of at least one of the plurality of Hall effect current sensors is adjusted in accordance with temperature of the conductor mechanical structure to compensate for thermal variations.

6. The current measuring apparatus of claim 1, further comprising a controller coupled to outputs of the plurality of hall effect sensors, and outputting a current measured flowing in the conductor with the effects of external noise substantially removed from the measurement.

7. The current measuring apparatus of claim 6, further comprising programming inputs to the controller, via a bus output providing the current measured.

8. A current measuring contactor comprising:
   a conductor mechanical structure formed in a generally planar U-shape such that an actual current to be measured enters into a first terminal of a first leg of the structure in a first direction, and exits the structure at an opposite end of the structure, from a first terminal of a second leg so that the current to be measured is directed in a second direction opposite to the first direction;
   a first semiconductor Hall effect sensor, of a plurality of hall effect sensors, disposed at the first leg;
   a second semiconductor Hall effect sensor, of the plurality of hall effect sensors, disposed at the second leg
   a third semiconductor Hall effect sensor, of the plurality of hall effect sensors, disposed at the first leg and side by side with the first Hall effect sensor;
   a fourth semiconductor Hall effect sensor, of the plurality of hall effect sensors, disposed at the second leg and side by side with the second Hall effect sensor, and the first, second, third and fourth semiconductor Hall effect sensors are disposed in a line across the conductor mechanical structure; and
   a contactor having a contactor switch plate operatively coupled to a coil selectively operable to electrically couple the second terminal of the first leg to the second terminal of the second leg and interrupt a current flow as desired.

9. The current measuring contactor of claim 8, further comprising a logic device coupled to a coil controlling the contactor switch plate and causing the contactor switch plate to open or close based on external commands received from a discrete input or via two serial busses.

10. The current measuring contactor of claim 9, wherein the contactor switch plate is opened if the measured current indicates that an electric short has been detected based on integration of amperes squared times seconds over time or if the rated current of the contactor is exceeded for a predetermined interval.

11. The current measuring contactor of claim 9, wherein the command to open the contactor if an overcurrent condition is detected incorporates a variable time delay that is programmable based on the direction of the current flow.

12. The current measuring contactor of claim 9, wherein the logic device implements initialization, identification, BIT, and current measurement processes.

* * * * *